(12) United States Patent
Meinders et al.

(10) Patent No.: US 7,483,770 B2
(45) Date of Patent: Jan. 27, 2009

(54) COOLING ASSEMBLY COMPRISING MICRO-JETS

(75) Inventors: Erwin Rinaldo Meinders, Eindhoven (NL); Celine Catherine Sarah Nicole, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 287 days.

(21) Appl. No.: 10/545,987

(22) PCT Filed: Feb. 9, 2004

(86) PCT No.: PCT/IB2004/050090

§ 371 (c)(1),
(2), (4) Date: Aug. 17, 2005

(87) PCT Pub. No.: WO2004/075292

PCT Pub. Date: Sep. 2, 2004

(65) Prior Publication Data
US 2006/0164805 A1     Jul. 27, 2006

(30) Foreign Application Priority Data
Feb. 20, 2003   (EP) .................................. 03100392

(51) Int. Cl.
*G06F 1/20* (2006.01)
(52) U.S. Cl. ................... 700/300; 361/382; 361/699; 156/345; 156/640; 62/171

(58) Field of Classification Search ............... 700/300; 156/345, 640; 361/382, 385, 699; 62/171, 62/259.2
See application file for complete search history.

(56) References Cited

U.S. PATENT DOCUMENTS

| | | | | |
|---|---|---|---|---|
| 5,310,440 A | * | 5/1994 | Zingher | 156/345.11 |
| 6,205,799 B1 | * | 3/2001 | Patel et al. | 62/132 |
| 6,484,521 B2 | * | 11/2002 | Patel et al. | 62/171 |
| 6,550,263 B2 | * | 4/2003 | Patel et al. | 62/259.2 |
| 6,612,120 B2 | * | 9/2003 | Patel et al. | 62/171 |
| 6,817,204 B2 | * | 11/2004 | Bash et al. | 62/304 |
| 2002/0152761 A1 | * | 10/2002 | Patel et al. | 62/259.2 |
| 2005/0121171 A1 | * | 6/2005 | Mukasa et al. | 165/80.3 |
| 2005/0185378 A1 | * | 8/2005 | Tilton et al. | 361/699 |
| 2006/0164805 A1 | * | 7/2006 | Meinders et al. | 361/689 |

\* cited by examiner

*Primary Examiner*—Albert Decady
*Assistant Examiner*—Douglas S Lee
(74) *Attorney, Agent, or Firm*—Michael E. Belk

(57) ABSTRACT

A cooling assembly for cooling a heat source, such an electronic components, with a coolant includes micro jets adapted to eject the coolant onto the heat source in response to a control signal, and a controller adapted to control the ejection of the coolant from the micro jets in a sweep mode in which the micro jets eject the coolant sequentially. The micro jets may be arranged as an array and the coolant is forced induce velocity perturbations of the coolant, to avoid the occurrence of free circulation areas in the cooling channel, and to obtain a microscopic transport of the cooling through the cooling channel.

22 Claims, 9 Drawing Sheets

COOLING ASSEMBLY COMPRISING MICRO-JETS

Figure 1:
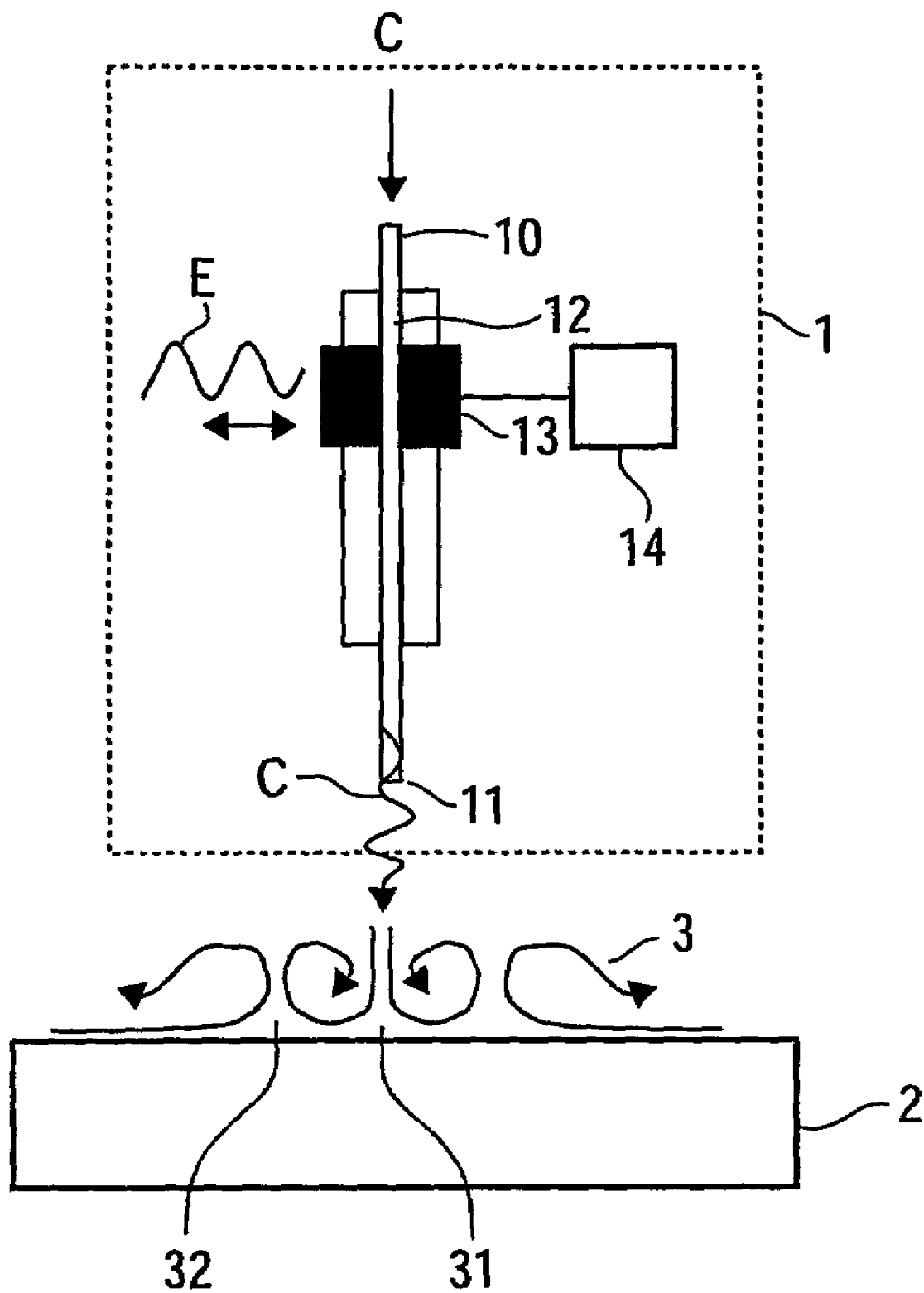

The present invention relates to a cooling assembly for cooling a heat source, in particular electronic components, with a coolant. Further, the present invention relates to a semiconductor device, a circuit board and a cooling method.

The ongoing miniaturisation of electronic components and handheld devices together with the increasing level of functionality lead on the one hand to very high power densities and on the other hand to high clock frequencies. Without appropriate cooling, large spatial and temporal temperature gradients and temperature levels might occur that deteriorate the performance and limit the lifetime of a consumer product. Conventional cooling methods, such as natural convection (buoyancy induced flows) and fan convection (forced convection) face their suitability for high power density applications because of the limited cooling capacity (natural convection) or the unacceptable noise production and high power consumption (fans). Therefore other solutions are required, such as water cooling or advanced cooling techniques like piezofans.

The new generation handheld devices, such as cellular phones, handheld computers, but also high quality electronic products like beamers, set-top boxes, flat televisions, DVD and BD recorders, etc., require new sophisticated cooling technologies that have low power consumption, are silent and have the capability of cooling high heat fluxes. Another requirement may be the degree of integration. Critical components with integrated cooling solutions can easily be integrated in devices without requiring a redesign of the device layout such that an optimum thermal performance is achieved.

EP 0 560 478 A1 discloses a cooling structure which is used for forced cooling of an electronic circuit package such as an integrated circuit. A cooling structure comprises a tubular fin member having many through-holes of small diameter, a flat plate member which is joined to and seals one end of the tubular fin member, a lid member attached to the other end of the tubular fin member and a pipe member used as a nozzle from which the coolant is jetted towards the plate member. According to an embodiment a spiral groove is formed on the inner surface of the nozzle so that a whirling movement is imparted to the coolant when it passes through the nozzle. In order to further promote the efficiency of heat transfer from the tubular fin to the coolant a number of such cooling structures may be arranged in line forming a cooling assembly.

It is an object of the present invention to provide a cooling assembly and a corresponding cooling method which have a low power consumption, are silent, have a high efficiency and allow integration with the heat source to be cooled.

The subject is achieved according to the present invention by a cooling assembly comprising:

a plurality of micro-jets adapted to eject the coolant onto the heat source in response to a control signal, and a controller adapted to control the ejection of the coolant from the micro-jets in a sweep mode in which the micro-jets eject the coolant subsequently.

The invention is based on the idea to use a plurality of micro-jets, which do not eject the coolant to the heat source simultaneously but are operated in a sweep mode, i.e. are activated subsequently one after another or in groups after another. In this way, a macroscopic transport of coolant is obtained through a cooling channel above the heat source to be cooled and the occurrence of re-circulation areas in the cooling channel can be diminished which occur when all micro-jets are controlled to eject the coolant simultaneously.

Further, a coolant flow into a preferred direction can be induced in the cooling channel so that an effective removal of hot coolant can be provided thus ensuring a high heat transfer coefficient. Furthermore, the macroscopic flow by subsequently addressing the micro-jets can be forced into a particular area of high temperature of heat flux.

A preferred embodiment of the micro-jets comprise:
an inlet for inflow of the coolant,
an outlet for ejection of the coolant,
a micro-channel for flow of the coolant from the inlet to the outlet, and
a forcing means for inducing velocity perturbations on the coolant in the micro-channel, wherein the micro-jets are arranged substantially perpendicular to the surface of the heat source.

The micro-jets are thus forced by an external field to induce velocity perturbations into the coolant in the axial or normal direction. The resulting high turbulence levels will lead to an enhanced convective heat transfer from the heat source to be cooled. Preferred forcing means comprise piezoelectric crystals, piezoelectric ceramics or woofers and a controller for controlling the forcing.

The coolant can be a gas, such as air or nitrogen, but also a liquid, such as water, which, however, requires a closed cooling system. For cooling electronic components mainly air is preferred as coolant.

An important aspect for obtaining a noiseless cooling assembly is the forcing frequency of the forcing means. A boundary condition with respect to the focussing frequency is that it should be very low, preferably below 200 Hz, or rather high, preferably above 10 kHz. The optimum frequency range depends on the aerodynamic properties of the entire system and needs to be experimentally determined. The sweeping rate, i.e. the frequency at which the micro-jets are activated and switched off, is also dependent on the system properties, like flow resistance, pressure drops, etc.

Preferred dimensions for the diameter of the micro channels of the micro-jets and for the distance of the outlet of the micro-jets from the surface of the heat source include about 10 μm to about 10 μm for the micro-channel diameter and about 0.1 mm to about 20 mm the distance. These parameters as well as the optimum micro-jet spacing are dependent on the system aspects, such as the channel width, the micro-channel diameter and the required flow-rate, i.e. the cooling capacity, through the system, and have to be determined experimentally.

According to another embodiment the micro-jets are substantially not perpendicular, but are placed at an inclined angle with respect to the surface of the heat source, in particular at an inclined angle in the range from 0° to 45°.

The plurality of micro-jets is preferably arranged as a two-dimensional array of micro-jets. Within said array the micro-jets can be arranged in-line, as a staggered matrix or on other geometries, such as being oriented in a circular or triangular shape. Different preferred sweeping modes include sweep schemes which are: Alternately sweep the rows and columns of micro-jets, alternately sweep the odd and even micro-jets per row and column, apply a sweep from the inside to the outside of the array, or starting from an edge. Further, the ejection of the coolant can be controlled such that the ejected coolant flows into a preferred direction above the heat source, for instance into the direction of a heat sink. It should be noted that this list of sweep schemes is not complete. Many other sweep schemes are possible as well.

According to further embodiments, the coolant can be either ejected continuously from all micro-jets according to a bias flow rate while only during predetermined time periods each micro-jet ejects an additional high amount of coolant. According to another embodiment, during most of the time no coolant is ejected, but only during predetermined time periods in order to activate the micro-jets.

The present invention also relates to a semiconductor device comprising a semiconductor element and a cooling assembly integrated with the semiconductor element for cooling it. Further, the present invention relates to a circuit board, comprising a semiconductor device and a cooling assembly arranged to cool the semiconductor device.

However, the invention is not limited to cooling semiconductor devices, but can also be adapted to cool any other heat sources, which require a high cooling capacity.

Figure 3A:
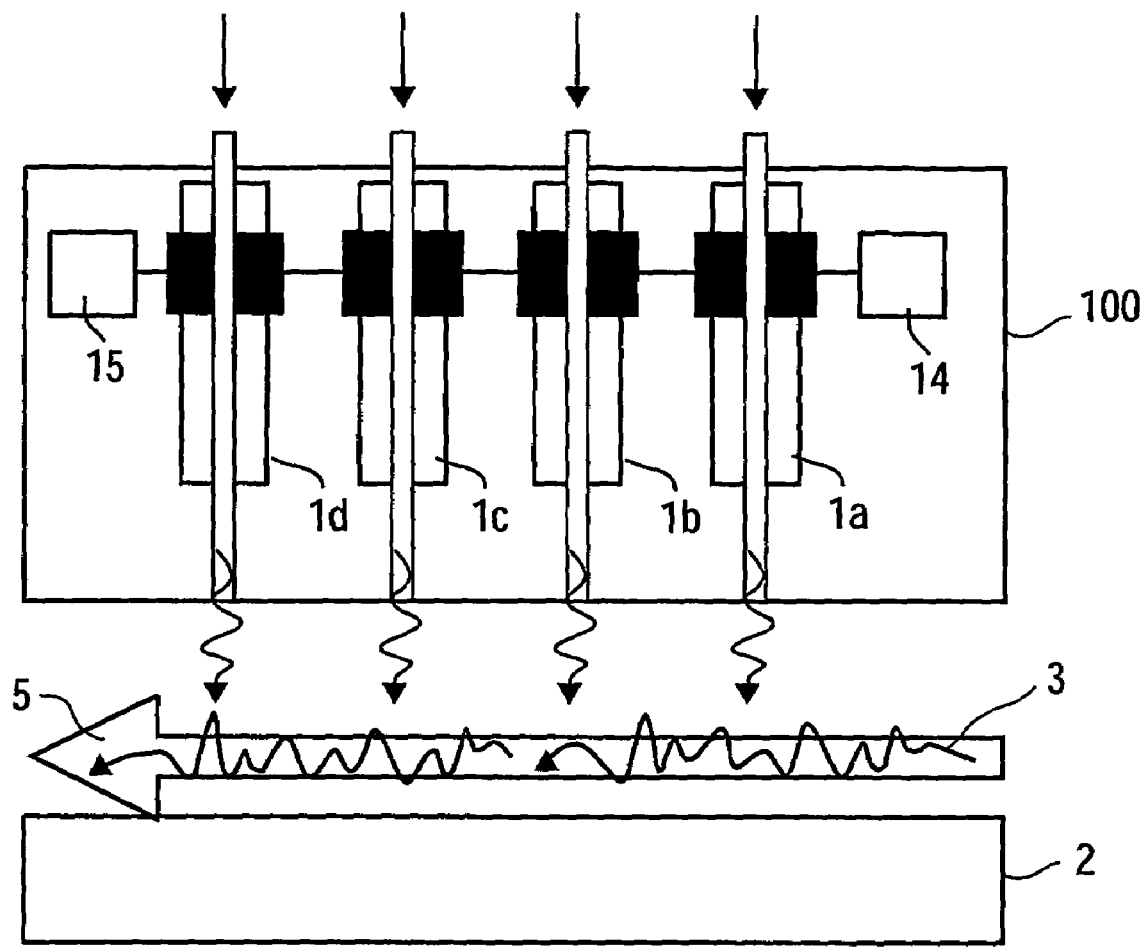
Figure 3B:
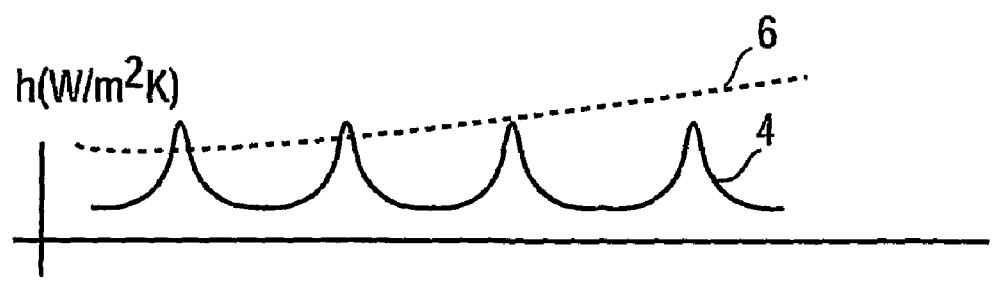
Figure 4:
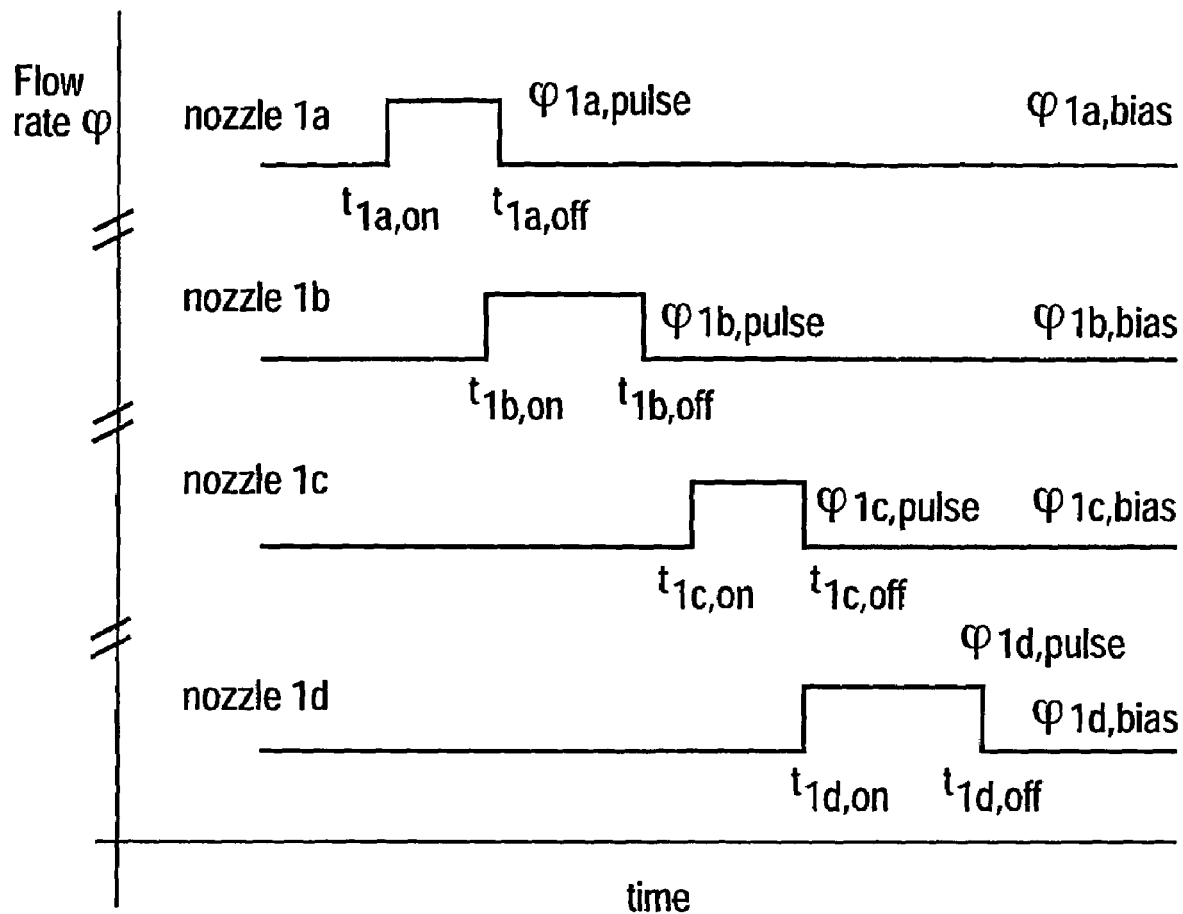
Figure 5A:
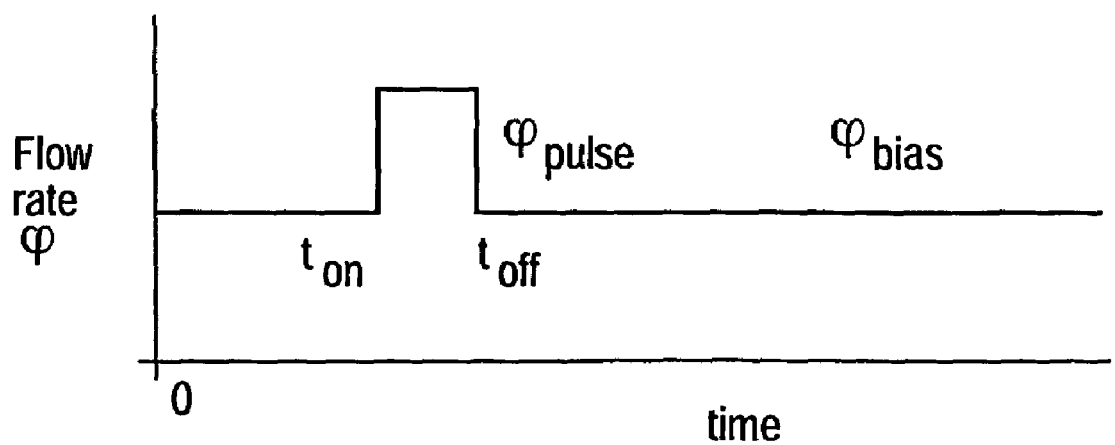
Figure 5B:
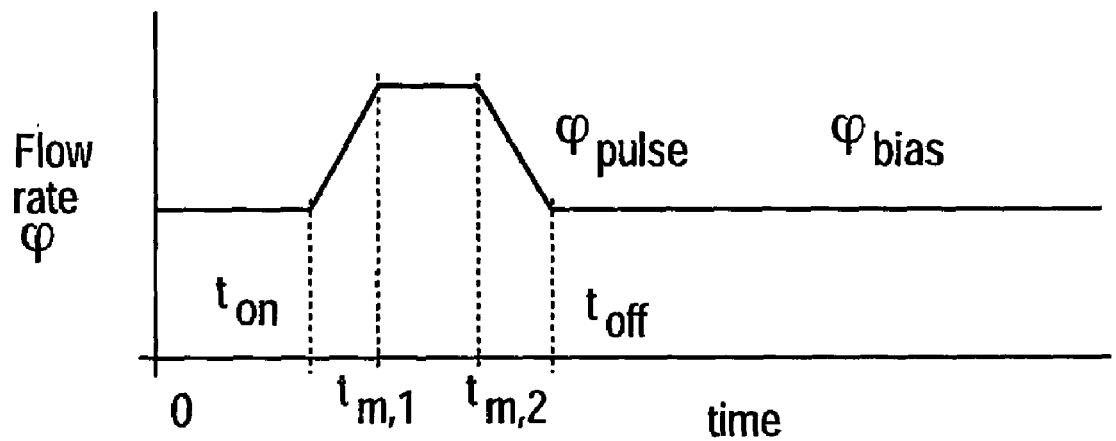
Figure 5C:
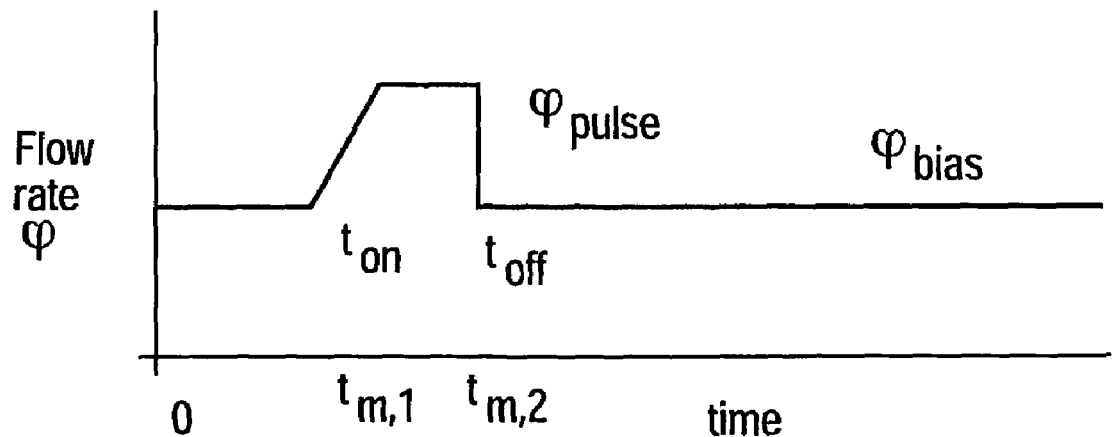
Figure 6:
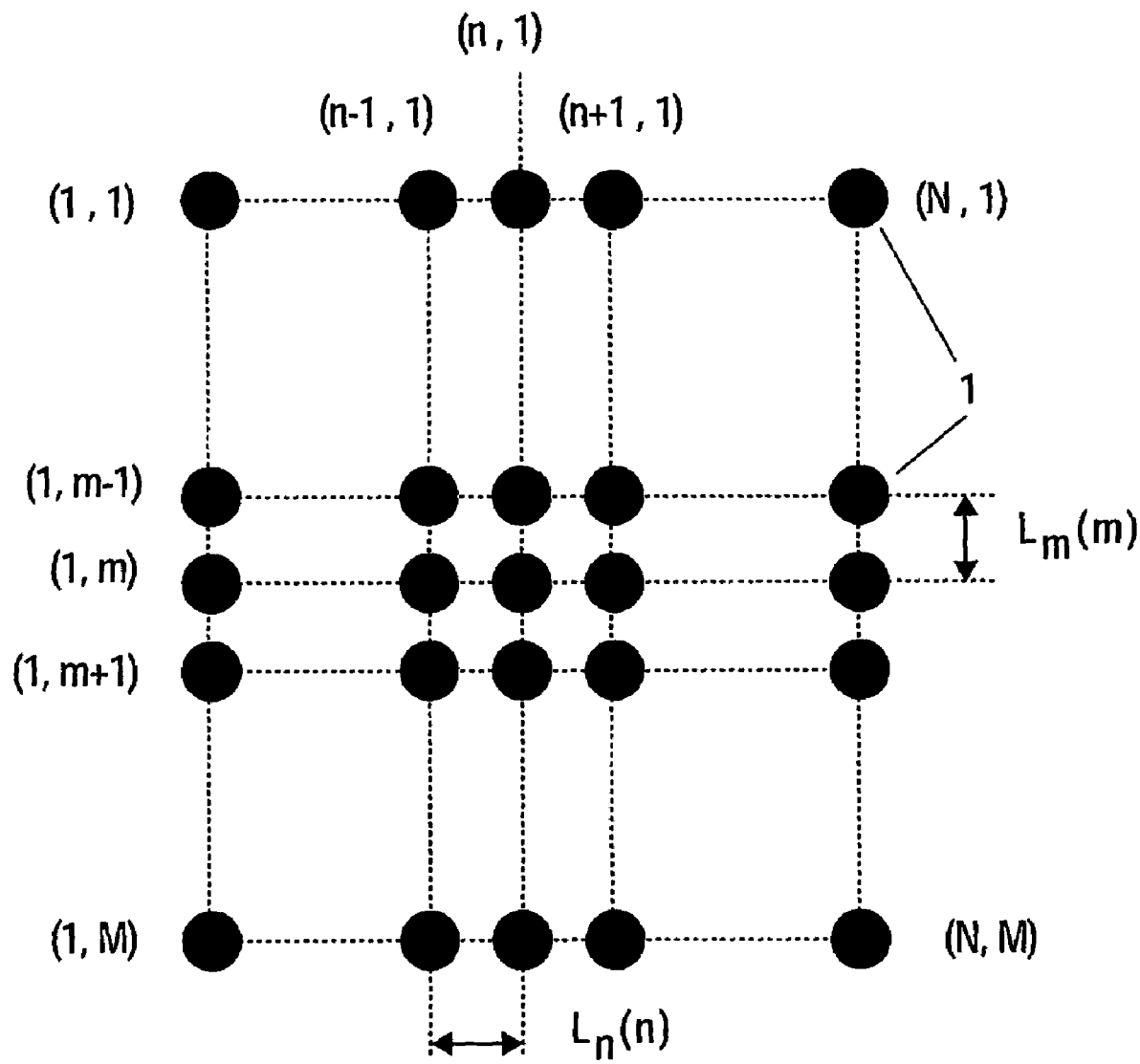
Figure 7:
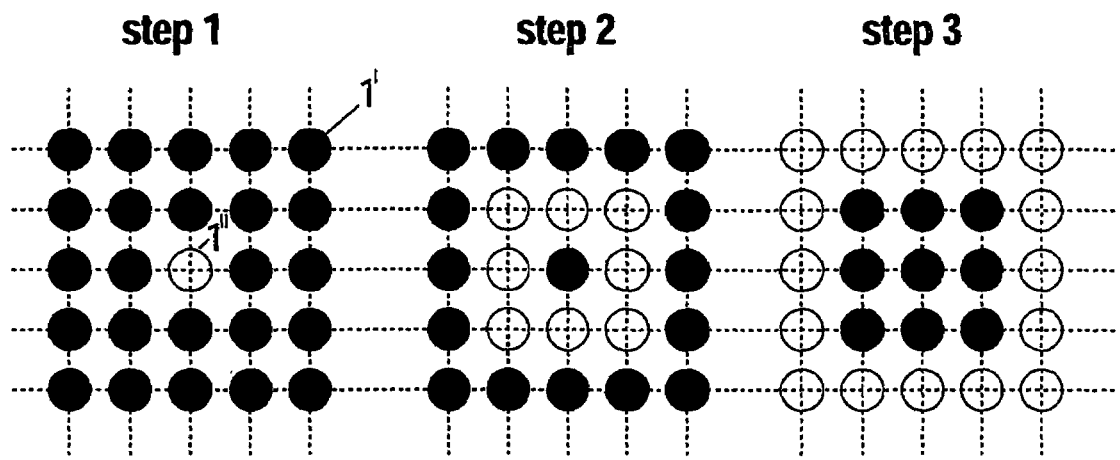
Figure 8:
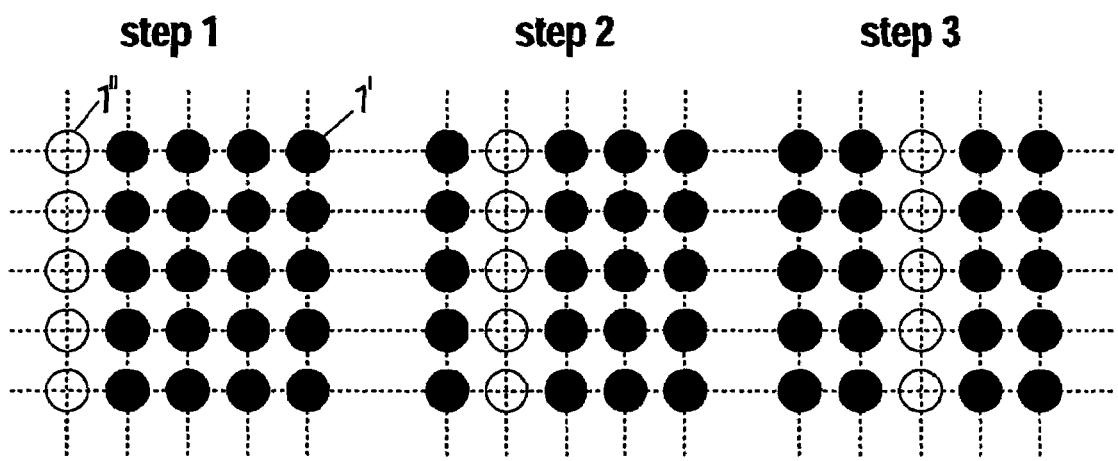
Figure 9:
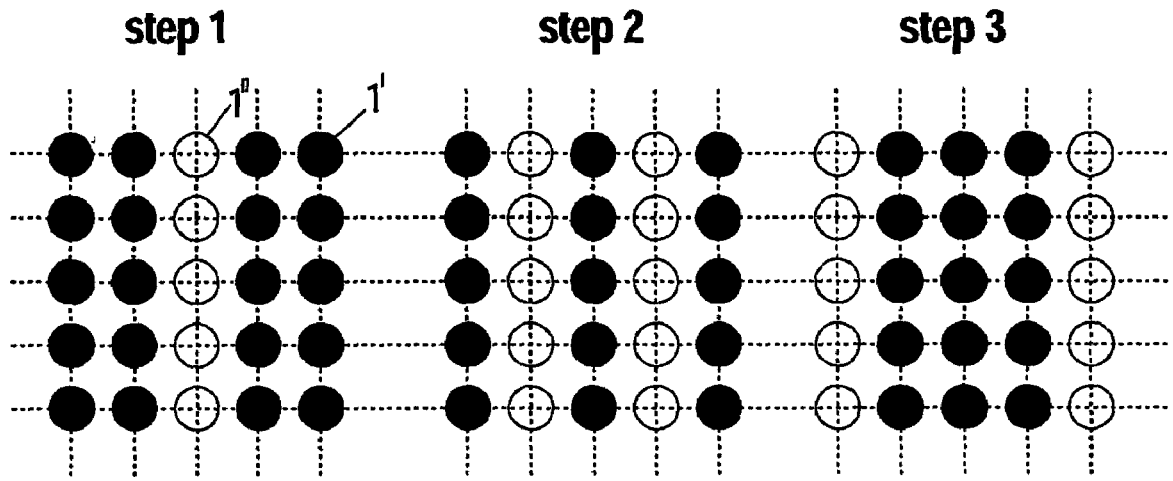
Figure 10:
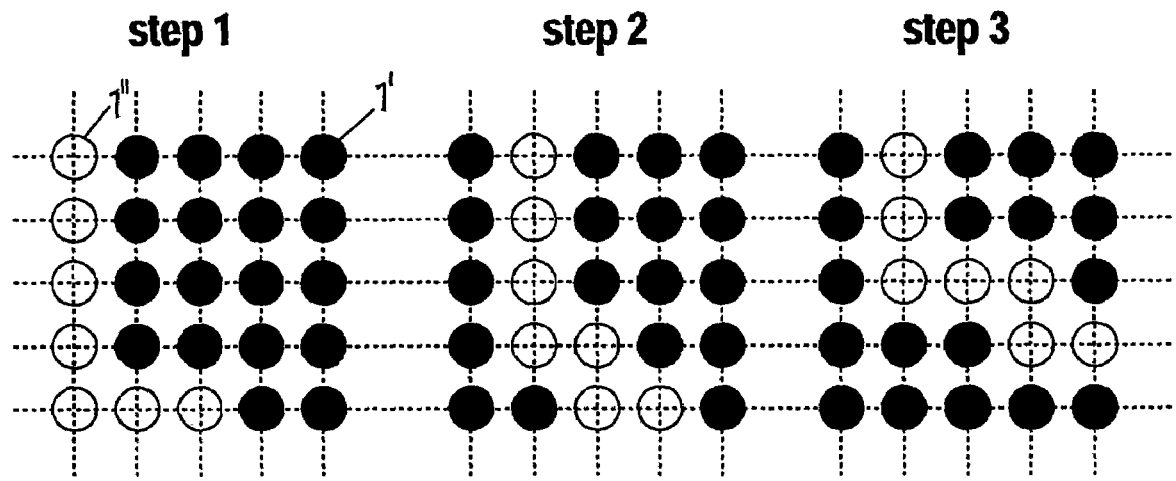
Figure 11:
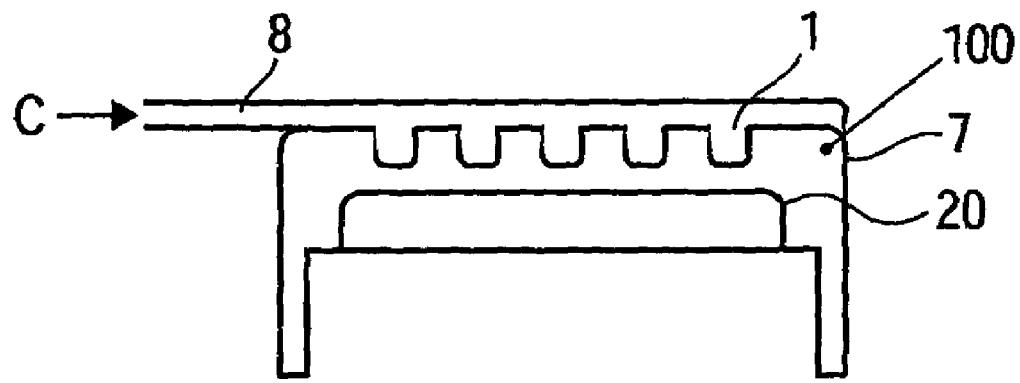
Figure 12:
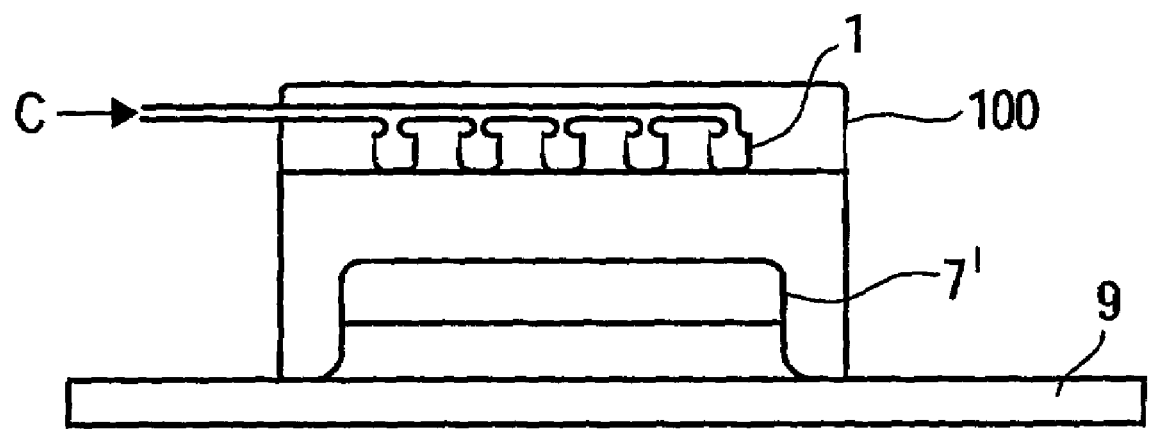

The present invention will now be explained with reference to the drawings in which FIG. 1 shows an embodiment of a single forced micro-jet according to the present invention, FIG. 2 shows an array of forced micro-jets operated in continuous mode, FIG. 3 shows an array of forced micro-jets operated in sweep mode according to the present invention, FIG. 4 shows the flow-rates of micro-jets shown in FIG. 3, FIG. 5 shows different pulse shapes, FIG. 6 shows an array of forced micro-jets according to the present invention, FIG. 7 illustrates a first embodiment of a sweep mode, FIG. 8 illustrates a second embodiment of a sweep mode, FIG. 9 illustrates a third embodiment of a sweep mode, FIG. 10 illustrates a forth embodiment of a sweep mode, FIG. 11 shows an embodiment of a cooling assembly integrated with a semiconductor device and FIG. 12 shows an embodiment of a circuit board with a cooling device and a semiconductor device mounted on top.

An embodiment of a single micro-jet according to the present invention is shown in FIG. 1. The micro-jet 1 comprises an inlet 10 for an inflow of a coolant C, an outlet 11 for ejection of the coolant, a micro-channel 12 for flow of the coolant from the inlet 10 to the outlet 11 and forcing means 13 for inducing velocity perturbations on the coolant C in the micro-channel 12, said forcing means 13 being controlled by a controller 14. The micro-jet is preferably arranged such that the micro-channel 12, which can be an isolated ordinary channel, tube or minichannel (e.g. submicron channel of nanometer size), is substantially perpendicular to the surface of the heat source 2 to be cooled as shown. However, the micro-channel 12 may also be arranged at an angle different from 90° to the surface of the heat source 2. Such an inclined arrangement may either enhance or diminish the occurrence of a macroscopic flow induced by the sweeping micro-jets.

The resulting flow pattern of the ejected coolant C after impinging on the surface of the heat source 2 is indicated by 3. It is well known that such flow has a high heat transfer coefficient in the vicinity of the point 31 where the flow impinges on the surface of the heat source 2, which point 31 is called a stagnation point. However, the re-circulative nature of such flow causes poor heat transfer performance at the separation points 32, located away from the stagnation point 31.

Forcing of the flow by an external field E is used to induce velocity perturbations into the undistorted inflow of the coolant and to increase the turbulence intensity. The axial channel flow 3 may be distorted in the axial, longitudinal or normal direction to increase the velocity perturbations, i.e. to enhance the turbulence intensity of the flow.

There are different possibilities to force a micro-jet. Preferably a woofer, for instance for a forced laminar wall flow, piecoelectric ceramics or a piezoelectric crystal can be used as forcing means 13. Such piezoelectric crystals or ceramics are, for instance, used in inkjet print heads to dose the flow through the channel such that only small droplets of ink are deposited on the to be printed substrate. Forcing of the flow can also be controlled by a sinusoidal, saw-tooth like, or short pulse modulation.

Figure 2A:
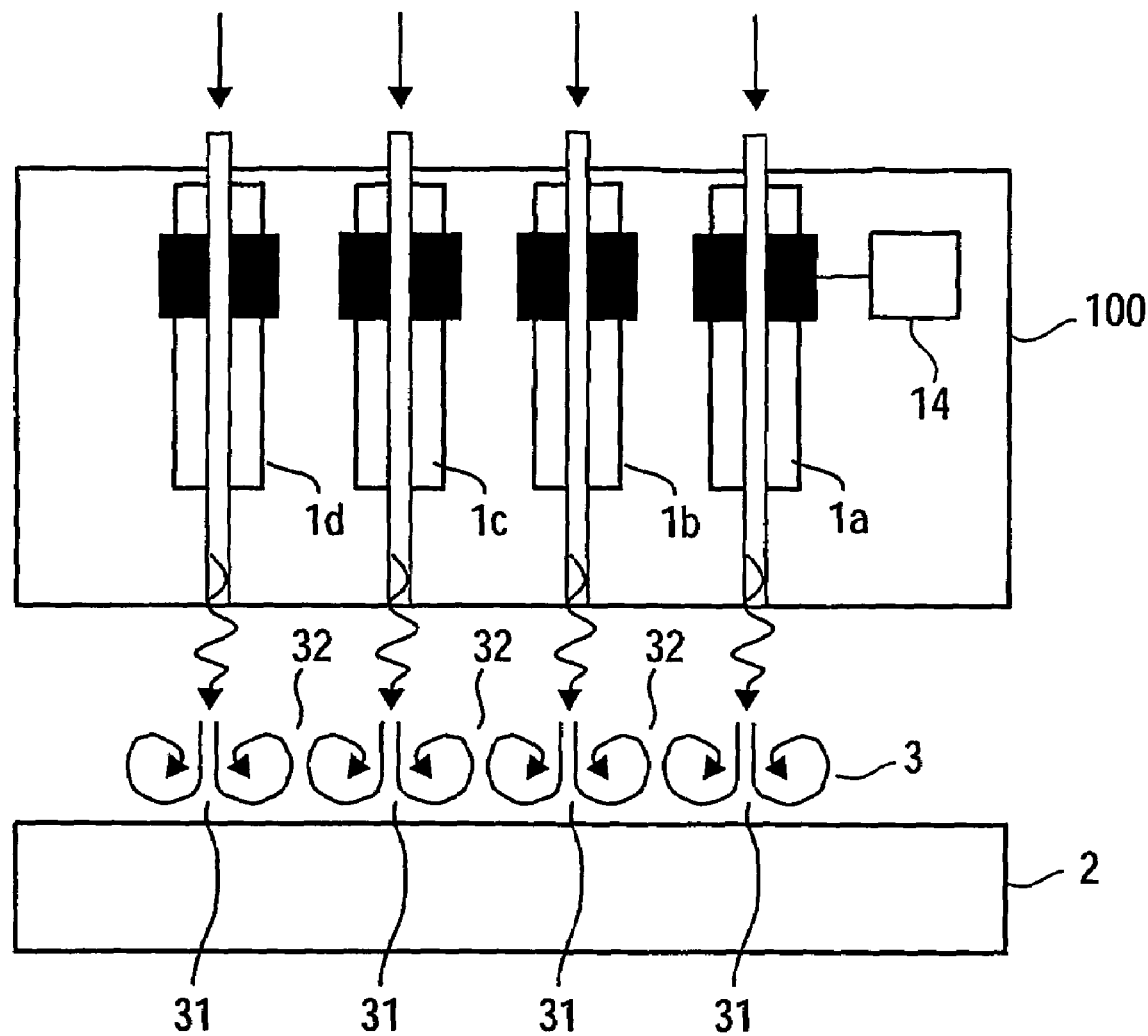
Figure 2B:

According to the invention an array of forced micro-jets $1a$, $1b$, $1c$, $1d$ forming a cooling assembly 100 is used as shown in FIG. 2a to enlarge the area to be cooled. A drawback of an array of multiple micro-jets $1a$-$1d$ located in staggered or in in-line arrangement is the occurrence of separation points 32 in the outflow 3 of the coolant when the micro-jets are operated simultaneously. The resulting flow pattern 3 consists of multiple stagnation points 31 and separation points 32. Separation points 32 are characterized by a dramatic reduction of the heat transfer coefficient as can be seen from the heat transfer coefficient distribution 4 shown in FIG. 2b. The maxima of the distribution 4 correspond to the stagnation points 31, the minima correspond to the separation points 32. The location of the separation points 32 and the strength of the heat transfer coefficient drop is determined by the in-line and off-axis spacing of the micro-jets $1a$-$1d$.

Garimella et al. have performed a theoretical study of the heat transfer characteristics of micro-jet arrays (Garimella et al., "Local heat transfer distributions in confined multiple air jet impingement", Journal of Elec. Pack., 2001, v. 123, p. 165). Some of the parameters that have been varied are the nozzle diameter and the distance to the heat source. Arrays with multiple micro-nozzles are considered for cooling applications in devices where space and noise is a constraint. Furthermore, different multiple nozzle configurations showing their heat transfer capabilities for electronics cooling applications are disclosed in Vukasinovic, J., and Glezer, A., "Countercurrent Flow of an Impinging Round Synthetic Jet", Bulletin of the American Physical Society-Division of Fluid Dynamics, Vol. 46, No. 10, pp. 196, 2001.

To overcome the problem of local hot spots by induced separation regions it is proposed according to the present invention to adjust the on-off frequency of the individual micro-jets such that the micro-jets are operated in a sweep mode. This is illustrated in FIG. 3. In addition to the plurality of micro-jets $1a$-$1d$ and the controller 14 for controlling the forcing, the cooling assembly further comprises a controller 15 for control of the ejection of coolant from the individual micro-jets. In contrast to the known arrays the micro-jets are operated such that the coolant is not ejected simultaneously from all micro-jets but a single micro-jet or groups of several micro-jets are activated one after another. This sweeping operation is controlled by the controller 15. For instance, the microjets in the present embodiment shown in FIG. 3a are activated subsequently one after another in the sequence $1a$, $1b$, $1c$, $1d$. In this way, a macroscopic transport of coolant occurs through the cooling channel as indicated by arrow 5, providing an effective removal of hot coolant and thus ensuring a high heat transfer coefficient. The occurrence of flow separation and stable re-circulative areas is significantly suppressed as shown from the resulting channel flow 3 because of the forced nature of this induced flow.

The corresponding heat transfer coefficient 6 of the sweep mode operation is shown in FIG. 3b. As can be seen there are no maxima or minima as in the distribution 4 for the continuous mode operation. The decay in the heat transfer coefficient 6 in the stream-wise direction is caused by heating up of the coolant in this direction.

FIG. 4 shows the flow-rates φ of the four micro-jets $1a$-$1d$ (also called nozzles) over time. As can be seen the nozzles are subsequently activated by a rectangular pulse, e.g. nozzle 1a is activated by pulse $\Phi_{1a,\ pulse}$, having a time duration of $t_{1a,\ off}$-$t_{1a,on}$. In the present example the pulses of nozzles 1a and 1b as well as the pulses of nozzles 1c and 1d slightly overlap in time.

Generally, the nozzles are either in an active (open) or passive (closed) state. However, this may lead to a lower effective flow-rate through the cooling assembly. An even more improved heat transfer can be achieved by providing a continuous bias flow-rate at all nozzles on which the additional flow-rate during activation of the individual nozzle is superimposed. This can also be seen from FIG. 4 where at times where the nozzles are not activated by the activation pulse the flow-rate $\Phi$ is for each level at a particular bias flow-rate $\Phi_{bias}$. The ratio between the additional flow-rate and the bias flow-rate can be determined, and mainly depends on different system parameters. Ratios between 0.1 and 100 seem to be feasible. It should be noted that the bias flow-rate can also be different for each nozzle.

Thus, the flow rate of each nozzle is time-dependent, and the maximum flow rate depends on the position of the nozzle in the cooling assembly. For instance, the maximum flow-rate through central nozzles in an array of nozzles can be controlled to be higher than that through the nozzles at the edges of an array. The present invention thus allows the use of different flow rate strategies, i.e. the use of a constant bias level with a time-dependent additional pulse-shaped flow rate. This additional flow rate will cause the macroscopic flow and can be considered as the sweeping factor.

Different possible pulse shapes are shown in FIG. 5. FIG. 5a shows a rectangular pulse, FIG. 5b a trapezium shaped pulse and FIG. 5c a third shape of a pulse. Further possible pulse shapes are, for instance, triangles, staircase-like etc.

An array of a plurality of micro-jets located on a cartesian grid having N columns and M rows is schematically shown in FIG. 6. The spacing $L_m$ (m) and $L_n$ (n) depend on the location in the matrix. The location for single micro-jet 1 is indicated with n and m. Such an arrangement shall be used in FIGS. 7 to 10 to illustrate different sweep modes used according to the present invention. In these figures the sweep modes are illustrated by showing three subsequent steps wherein a filled circle 1' indicates a passive (or closed) micro-jet, i.e. which is controlled not to eject coolant, while an empty circle 1" indicates an active (or open) micro-jet, i.e. which is controlled to eject coolant. It shall be noted that a bias level may be present in both the active and passive state of the micro-jet.

In the first embodiment of the sweep mode shown in FIG. 7 the individual micro-jets are controlled to eject coolant subsequently from the centre towards the edge of the array in a sort of expansion mode. The ejected coolant is thus forced to flow from the centre towards the edge.

According to the embodiment shown in FIG. 8 the micro jets are addressed column-wise from left to right. Alternatively, the micro-jets could also be addressed row-wise, or in one cycle the micro-jets can be addressed column by column, while in the next cycle the micro-jets are addressed row by row.

In the embodiment shown in FIG. 9 the micro-jets of the central column (or row) are addressed first, while subsequently micro-jets in columns (or rows) towards the edges. In this embodiment the flow of coolant in the central part of the array can be accelerated.

Still a further embodiment is shown in FIG. 10 according to which micro-jets in the lower left corner are addressed first, while subsequently micro-jets towards the upper left corner are addressed. Thus, a flow of coolant into a predefined direction can be obtained, here into the direction of the upper left corner. It should be clear that an unlimited number of further sweep modes is also possible which shall also be covered by the present invention.

An embodiment of a semiconductor device 7 comprising a semiconductor element 20, the surface of which shall be cooled, and an array of micro-jets 1 integrated therewith is shown in FIG. 11. To provide the micro-jets 1 with coolant C a coolant supply 8 is provided on the upper part. The micro-jets are spread over the whole surface of the semiconductor element 2 to provide efficient cooling.

An embodiment of a circuit board 9 onto which a semiconductor device 7' and a cooling assembly 100 according to the present invention are mounted are shown in FIG. 12. In this embodiment the cooling assembly 100 is not integrated within the semiconductor device 7' but is located, as a separate element, above the semiconductor device 7'.

By the present invention an efficient cooling of heat sources, in particular electronic components can be achieved. By operation of the micro-jets in sweep mode the occurrence of re-circulation areas in the cooling channel is effectively prevented and a coolant flow into a preferred direction can be induced. A macroscopic transport of coolant can thus be caused by the sweeping enabling effective cooling of high heat fluxes.

The invention claimed is:

1. A cooling assembly for cooling a heat source with a coolant comprising:
   a plurality of micro jets adapted for ejection of the coolant onto the heat source in response to a control signal, and
   a controller adapted to control the ejection of the coolant from the micro-jets,
   said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source, wherein the micro jets are placed at an inclined angle with respect to a surface of the heat source.

2. The cooling assembly as claimed in claim 1, wherein the micro jets comprise:
   an inlet for inflow of the coolant,
   an outlet for ejection of the coolant,
   a micro-channel for flow of the coolant from the inlet to the outlet, and
   a forcing means for inducing velocity perturbations on the coolant in the micro-channel,
   wherein the micro-jets are arranged substantially perpendicular to the surface of the heat source.

3. The cooling assembly as claimed in claim 2, wherein said forcing means comprises a piezoelectric crystal, piezoelectric ceramics or a woofer and a controller for controlling the forcing.

4. The cooling assembly as claimed in claim 1, wherein the coolant is a fluid, in particular water, or a gas, in particular air or nitrogen.

5. A cooling assembly for cooling a heat source with a coolant comprising:
   a plurality of micro jets adapted for ejection of the coolant onto the heat source in response to a control signal, and
   a controller adapted to control the ejection of the coolant from the micro-jets,
   said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source,
wherein the micro jets comprise:
an inlet for inflow of the coolant,
an outlet for ejection of the coolant,
a micro-channel for flow of the coolant from the inlet to the outlet, and
a forcing means for inducing velocity perturbations on the coolant in the micro-channel and
wherein the forcing frequency of the forcing means is in a frequency range below 200 Hz or above 10 kHz.

6. A cooling assembly for cooling a heat source with a coolant comprising:
a plurality of micro jets adapted for ejection of the coolant onto the heat source in response to a control signal, and
a controller adapted to control the ejection of the coolant from the micro-jets,
said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source,
wherein the micro jets comprise:
an inlet for inflow of the coolant,
an outlet for ejection of the coolant, and
a micro-channel for flow of the coolant from the inlet to the outlet,
wherein the diameter of the micro-channels is in the range from about 10 µm to about 10 mm.

7. A cooling assembly for cooling a heat source with a coolant comprising:
a plurality of micro jets adapted for ejection of the coolant onto the heat source in response to a control signal, and
a controller adapted to control the ejection of the coolant from the micro-jets,
said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source,
wherein the micro jets comprise:
an inlet for inflow of the coolant,
an outlet for ejection of the coolant, and
a micro-channel for flow of the coolant from the inlet to the outlet,
wherein the distance of the outlet of the micro jets from the surface of the heat source is in the range from about 0.1 mm to about 20 mm.

8. The cooling assembly as claimed in claim 1, wherein the plurality of micro jets is arranged as a two-dimensional array of micro jets.

9. A cooling assembly for cooling a heat source with a coolant comprising:
a plurality of micro jets adapted for ejection of the coolant onto the heat source in response to a control signal, and
a controller adapted to control the ejection of the coolant from the micro-jets,
said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source,
wherein the plurality of micro jets is arranged as a two-dimensional array of micro jets, and
wherein the controller is further adapted for controlling the ejection of the coolant such that the coolant is subsequently ejected from a central to outer micro jets or vice versa.

10. A cooling assembly for cooling a heat source with a coolant comprising:
a plurality of micro jets adapted for ejection of the coolant onto the heat source in response to a control signal, and
a controller adapted to control the ejection of the coolant from the micro-jets,
said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source,
wherein the plurality of micro jets is arranged as a two-dimensional array of micro jets, and
wherein the controller is further adapted for controlling the ejection of the coolant such that the coolant is alternately ejected from micro jets in even and odd rows or columns.

11. A cooling assembly for cooling a heat source with a coolant comprising:
a plurality of micro jets adapted for ejection of the coolant onto the heat source in response to a control signal, and
a controller adapted to control the ejection of the coolant from the micro-jets,
said controller being configured to control the ejection of the coolant from the micro jets in a sweep mode where the coolant is swept across the heat source such that local hot spots of the heat source with lower heat transfer rates are reduced to prevent formation of heat transfer minimum and maximum across the heat source,
wherein the plurality of micro jets is arranged as a two-dimensional array of micro jets, and
wherein the controller is further adapted for controlling the ejection of the coolant such that the flow of ejected coolant is forced into a predetermined direction.

12. The cooling assembly as claimed in claim 1, wherein the controller is further adapted to control the micro jets such that the micro jets eject a bias amount of coolant continuously according to a bias flow rate and eject a higher amount of coolant during a predetermined time period according to an additional flow rate, the higher amount being superimposed over the bias amount.

13. The cooling assembly as claimed in claim 1, wherein the controller is further adapted for controlling the micro jets such that only during predetermined time periods coolant is ejected.

14. A semiconductor device, comprising:
a semiconductor element and
the cooling assembly as claimed in claim 1 integrated with the semiconductor element for cooling the semiconductor element.

15. A circuit board, comprising:
a semiconductor device and
the cooling assembly as claimed in claim 1 arranged to cool the semiconductor device.

16. A cooling method for cooling a heat source, in electronic components, with a coolant, comprising the acts of:
ejecting the coolant onto the heat source in response to a control signal using a plurality of micro jets placed at an inclined angle with respect to a surface of the heat source, and
controlling the ejecting act in a sweep mode where the coolant is swept across the heat source such that local hot spots of the heat source with lower heat transfer rates are reduced to prevent formation of heat transfer minimum and maximum across the heat source.

17. The cooling assembly as claimed in claim 6, wherein the diameter of the micro-channels is in the range from about 50 μm to about 5 mm.

18. The cooling assembly as claimed in claim 7, wherein the distance of the outlet of the micro-jets from the surface of the heat source is in the range from about 0.5 mm to about 10 mm.

19. The cooling assembly as claimed in claim 1, wherein the micro-jets are placed at an inclined angle with respect to the heat source in the range from about 0° to about 45°.

20. The cooling assembly of claim 1, wherein the controller is further configured to control the ejection of the coolant from the micro jets in a sweep mode in which the micro jets eject the coolant sequentially.

21. The cooling assembly of claim 1, wherein the controller is further configured to reduce re-circulation of the coolant in the cooling channel and flow separation across the heat source.

22. The cooling assembly of claim 1, wherein the controller is further configured to superimpose a bias amount of coolant for continuous discharge from the plurality of micro jets over the ejection of the coolant in the sweep mode where coolant of larger quantity than the bias amount is sequentially ejected from plurality of micro jets to direct the coolant in at least one desired direction.

* * * * *